(12) United States Patent
Yamamoto (10) Patent No.: US 8,076,678 B2
(45) Date of Patent: Dec. 13, 2011

(54) PACKAGE FOR PHOTOELECTRIC WIRING AND LEAD FRAME

(75) Inventor: Takanori Yamamoto, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 340 days.

(21) Appl. No.: 12/545,989

(22) Filed: Aug. 24, 2009

(65) Prior Publication Data

US 2010/0044723 A1 Feb. 25, 2010

(30) Foreign Application Priority Data

Aug. 25, 2008 (JP) ................. 2008-215271

(51) Int. Cl.
*H01L 27/15* (2006.01)
*H01L 29/16* (2006.01)
*H01L 31/12* (2006.01)
*H01L 33/00* (2010.01)

(52) U.S. Cl. ............... 257/82; 257/83; 257/84

(58) Field of Classification Search ............ 257/82, 257/83, 84

See application file for complete search history.

(56) References Cited

U.S. PATENT DOCUMENTS 7,476,913 B2 * 1/2009 Isobe et al. ............ 257/98
2002/0136256 A1 * 9/2002 Hamasaki et al. ........ 372/50
2006/0120249 A1 * 6/2006 Suh et al. ............. 369/112.27
2010/0303405 A1 * 12/2010 Tagami ................. 385/14

FOREIGN PATENT DOCUMENTS

JP 2003-050329 2/2003
JP 2006-292852 10/2006

* cited by examiner

*Primary Examiner* — Fernando L Toledo
(74) *Attorney, Agent, or Firm* — Rankin, Hill & Clark LLP (57) ABSTRACT

A package for a photoelectric wiring in which a pair of light emitting and receiving devices are mounted as optical devices on a lead frame having an optical waveguide in which an optical waveguide having a plurality of core portions disposed in parallel and surrounded by a cladding is mounted on a support plate of a lead frame having a mirror section including the support plate for supporting the optical waveguide, mirror sections having a mirror surface portion formed by bending both edges of the support plate at an angle of 45 degrees with respect to a planar direction of the support plate in a side direction, and lead portions to be electrically connected to the optical devices, the support plate, the mirror sections and the lead sections being formed by pressing a metallic material, wherein the light emitting device and the light receiving device are mounted in alignment with an optical path of a light reflected by the mirror surface portion and transmitted through the core portions at one of sides and the other side which interpose the optical waveguide of the package for an optical waveguide wiring therebetween.

11 Claims, 6 Drawing Sheets

PACKAGE FOR PHOTOELECTRIC WIRING AND LEAD FRAME

This application claims priority to Japanese Patent Application No. 2008-215271, filed Aug. 25, 2008, in the Japanese Patent Office. The Japanese Patent Application No. 2008-215271 is incorporated by reference in its entirety.

TECHNICAL FIELD

The present disclosure relates to a package for a photoelectric wiring including an optical waveguide for transmitting a light signal and an optical device for converting a light signal and an electric signal, and a lead frame which is used in the package.

RELATED ART

With an increase in a speed of a semiconductor device such as a microprocessor, there has been investigated a method of replacing an electric wiring to be used for transmitting a signal with an optical wiring and transmitting the signal by utilizing the optical wiring. In order to replace the electric wiring with the optical wiring, it is preferable to replace the electric wiring through an optical waveguide, to dispose optical devices (a light emitting device and a light receiving device) on both ends of the optical waveguide, respectively, to optically couple the optical devices to the optical waveguide, and to electrically connect the optical devices to signal lines.

For an arrangement in which the optical devices and the optical waveguide are optically coupled to each other, there has been proposed a method of disposing the optical waveguide on a surface of a board, disposing mirrors for reflecting a light by 90 degrees at both ends of the optical waveguide, and surface mounting each of the optical devices in alignment with an optical path of the light reflected by the corresponding mirror (see Patent Documents 1 and 2).

[Patent Document 1] JP-A-2006-292852 Publication
[Patent Document 2] JP-A-2003-50329 Publication For a method of forming the mirror on a board, it is possible to propose a method of disposing a mirror member formed separately from the board in alignment with the board, and a method of swelling plating to form the mirror on the surface of the board. Referring to the method of disposing the mirror member on the board, however, it is hard to accurately dispose the mirror member on the board. Moreover, there is a problem in that it is hard to accurately set a tilt angle of the mirror in the method of forming the mirror through the plating.

For a method of forming an optical waveguide on a board, moreover, it is possible to propose a method of using resin materials having different refractive indices from each other to form the optical waveguide by utilizing an optical patterning process. Referring to the method, the optical waveguide is formed after the mirror is formed. Therefore, it is necessary to carry out an exposure by keeping away from the mirror (a slant face portion) in order to prevent the mirror from being exposed to a light when carrying out patterning over the optical waveguide. For this reason, there is a problem in that it is impossible to form the optical waveguide close to a mirror surface portion (the slant face portion), resulting in an increase in a spacing between the mirror surface portion and an end face of the optical waveguide to cause a loss of a light signal.

SUMMARY

Exemplary embodiments of the present invention provide a package for a photoelectric wiring which can easily form, with high precision, a mirror for optically coupling an optical device to an optical waveguide and can readily replace an electric wiring with an optical wiring, and a lead frame which is used in the package.

Exemplary embodiments of the invention have the following structures.

More specifically, a lead frame comprises:

a support plate;

mirror sections formed on both edges of the support plate, each of the mirror sections having a mirror surface portion inclined at an angle of about 45 degrees with respect to a planar direction of the support plate in a side direction; and lead sections, wherein the support plate, the mirror sections and the lead sections are monolithic with each other.

Moreover, the support plate has a planar shape of a rectangle and is adapted to support an optical waveguide, each of the mirror sections has a bonding portion formed on an end of the mirror surface portion in parallel with the planar direction of the support plate, and each of the lead sections has a pad adapted to be electrically connected to an optical device and a connecting lead portion adapted to be connected to a mounting board.

Furthermore, the lead frame further comprises:

an optical waveguide mounted on the support plate, the optical waveguide having a plurality of core portions disposed in parallel and a cladding surrounding the core portions, wherein the optical waveguide is mounted with an end face aligned with the mirror surface portion.

In addition, the lead frame further comprises:

a resin which seals the lead frame including the optical waveguide to form a resin sealing portion, the resin sealing portion having an optical opening portion provided in a portion of an optical path of a light which is incident on and radiated from the core portion of the optical waveguide.

Moreover, a package for a photoelectric wiring comprises:

the above-mentioned lead frame; and a pair of light emitting device and light receiving device mounted on the lead frame and eclectically connected to the lead portions, respectively, wherein the light emitting device and the light receiving device are mounted in alignment with an optical path of a light reflected by the mirror surface portion and transmitted through the core portions at both ends of the optical waveguide.

Furthermore, it is also possible to employ a structure in which the lead frame has a resin which seals the lead frame including the optical waveguide to form a resin sealing portion, the resin sealing portion having optical opening portions provided in a portion of the optical path of a light which is incident on and radiated from the core portion of the optical waveguide, and the optical emitting device and the optical receiving device are mounted on an external surface of the resin sealing portion in alignment with the optical opening portions.

The package for a photoelectric wiring according to the invention is formed by utilizing the lead frame having the mirror section which is formed by the pressing work. Consequently, it is possible to form, with high precision, the mirror surface portion provided between the optical waveguide and the optical device. By adjusting the mounting position on the lead frame having an optical waveguide to mount the optical device thereon, moreover, it is possible to provide the package for a photoelectric wiring having no variation in a characteristic. In the package for a photoelectric wiring, it is possible to easily replace the electric wiring with the optical wiring by mounting the package for a photoelectric wiring on a portion where the electric wiring is to be replaced with the optical wiring. Thus, the package for a photoelectric wiring can be suitably utilized for a board to mount a high-speed device such as a microprocessor thereon.

Other features and advantages may be apparent from the following detailed description, the accompanying drawings and the claims.

DETAILED DESCRIPTION

Embodiments of a package for a photoelectric wiring according to the invention will be described below together with structures of a lead frame having a mirror section and a lead frame having an optical waveguide which are used in the package for a photoelectric wiring and methods of manufacturing them.

(Lead Frame having Mirror Section)

Figure 1A:
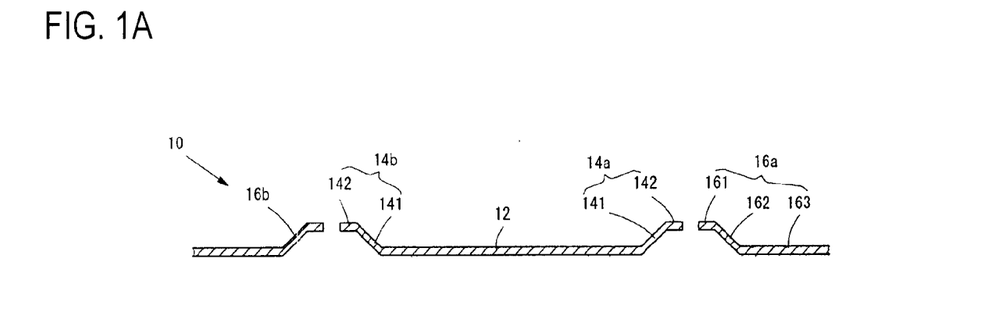
FIG. 1A is a sectional view showing a lead frame having a mirror section and FIG. 1B is a plan view showing the lead frame having the mirror section.
Figure 1B:
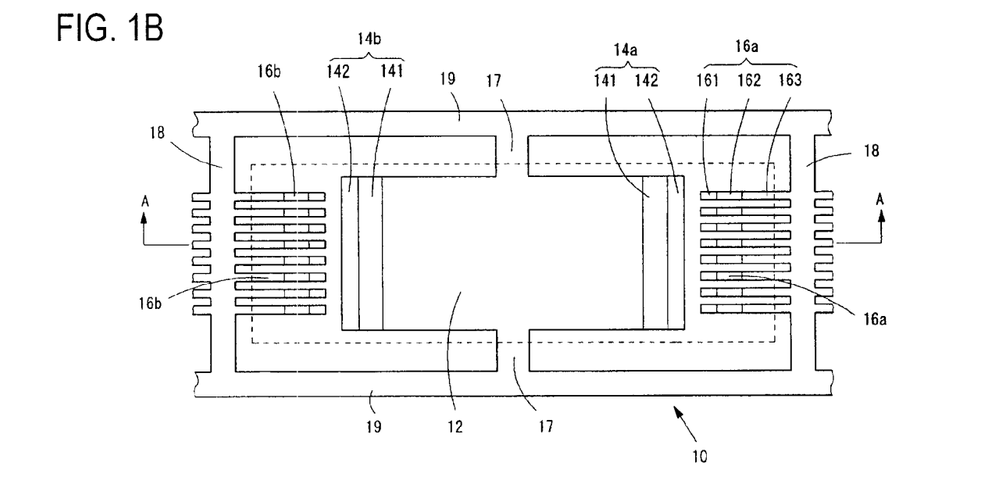

FIGS. 1A and 1B show a structure of a lead frame having a mirror section. FIG. 1A is a sectional view taken along an A-A line in FIG. 1B of a lead frame 10 having a mirror section and FIG. 1B is a plan view.

The lead frame 10 is formed by pressing a metallic band-shaped member in the same manner as a method of manufacturing a general lead frame. FIGS. 1A and 1B show a single unit portion of the lead frame 10 which is formed by pressing the metallic band-shaped member.

The lead frame 10 includes a support plate 12, mirror sections 14a and 14b, and lead portions 16a and 16b. The support plate 12 is formed to take a planar shape of a rectangle and serves to mount an optical waveguide thereon. The mirror sections 14a and 14b are formed along both edge portions of the support plate 12. The lead portions 16a and 16b are provided opposite to the mirror sections 14a and 14b. The mirror sections 14a and 14b are arranged symmetrically with a transverse centerline of the support plate 12 interposed therebetween, and the lead sections 16a and 16b are also arranged symmetrically with respect to the centerline. The support plate 12, the mirror sections 14a and 14b and the lead sections 16a and 16b are monolithic with each other.

An optical waveguide is a thin film-shaped component taking a planar shape of a rectangle and formed separately from the lead frame 10. The support plate 12 serves to support the optical waveguide flatly and is formed to take a planar shape adapted to a size of the optical waveguide (vertical and horizontal dimensions).

An optical waveguide 22 having different number of core portions having different lengths is mounted on the lead frame 10. For the lead frame 10, accordingly, there are provided various products including the support plate 12 adapted to the size and configuration of the optical waveguides 22. The lead frame 10 is formed by the pressing work (for example, by stamping). Therefore, it is possible to easily manufacture products in which the support plate 12 has various sizes and the numbers of the lead sections 16a and 16b are varied.

The mirror sections 14a and 14b are constituted by mirror surface portions 141, and bonding portions 142. The mirror surface portions 141 are formed by bending both ends of the support plate 12 at an angle of about 45 degrees with respect to a planar direction of the support plate 12 in a side direction. The bonding portions 142 are formed by bending in parallel with the planar direction of the support plate 12 along edges of the mirror surface portions 141.

The mirror surface portion 141 serves to reflect, by 90 degrees, a light which is radiated from the optical waveguide mounted on the support plate 12 or a light which is incident on the optical waveguide.

The mirror sections 14a and 14b are also formed by the pressing work. Very high processing precision is obtained by the pressing work. By the work using a pressing mold, it is possible to accurately set a tilt angle of the mirror surface portion 141 to be 45 degrees.

The mirror surface portion 141 needs to have a sufficient reflectance for a wavelength to be used in an optical wiring. An iron based material, a copper based material or an aluminum based material is used for the lead frame. Depending on the wavelength to be used for the optical wiring, a material to be utilized for the lead frame 10 is selected to obtain the mirror surface portion 141 having a desired reflectance by only the pressing work.

In order to enhance the reflectance of the mirror surface portion 141, it is also possible to apply plating such as gold plating or silver plating to a light reflecting surface of the mirror surface portion 141. In a process for manufacturing the lead frame 10, protective plating such as gold plating is applied to the lead sections 16a and 16b in order to reliably carry out an electrical connection in some cases. In the protective plating process, it is also possible to apply the plating to the mirror surface portion 141.

By finishing the mirror surface portion 141 to be a smooth surface, it is possible to enhance the reflectance in the mirror surface portion 141. It is also possible to easily carry out the pressing work in such a manner that the mirror surface portion 141 is caused to be the smooth surface. It is also possible to enhance a smoothness of the mirror surface portion 141 by the plating. Moreover, it is also possible to utilize a method of polishing the mirror surface portion 141, a method of sticking a film having a high light reflectance onto the mirror surface portion 141 and a method of applying a resin having a high light reflectance.

The lead sections 16a and 16b are provided to electrically connect an optical device mounted on the package for a photoelectric wiring to a signal line (a wiring).

In the embodiment, the lead sections 16a and 16b are formed to take sectional shapes which are symmetrical with respect to the mirror sections 14a and 14b. More specifically, the lead sections 16a and 16b are constituted by pads 161 coupling portions 162, and connecting lead portions 163. The pads 161 are formed in an opposed arrangement to the bonding portions 142 on a level with the bonding portions 142 formed in the mirror sections 14a and 14b. The coupling portions 162 are formed to take a symmetrical shape with respect to the mirror surface portions 141. The connecting lead portions 163 are formed on a level with the support plate 12.

The pad 161 is provided in an identical planar arrangement to an electrode formed in the optical device to be surface mounted.

The support plate 12 and the lead sections 16a and 16b are supported on a side rail 19 through hanging leads 17 and 18. A structure of the hanging leads is the same as that of a general lead frame. A guide pin hole for positioning the lead frame 10 can also be formed on the side rail 19. Moreover, the lead frame 10 is sealed with a resin at a subsequent step. A region shown in a broken line of the drawing indicates a resin sealing region. For the resin sealing, it is also possible to form a dam bar corresponding to the resin sealing region. The dam bar is cut and removed after the resin sealing.

The lead frame 10 according to the embodiment has the mirror sections 14a and 14b and the lead sections 16a and 16b in solid structures and is formed through an identical pressing process to a general lead frame. Accordingly, the lead frame 10 can be manufactured by utilizing related-art lead frame manufacturing equipment. Thus, a mass production can be carried out. Furthermore, it is also possible to form, without a variation, a structure requiring high precision in a shape for the mirror surface portions 141 of the mirror sections 14a and 14b.

(Lead Frame having Optical Waveguide)

Figure 2A:
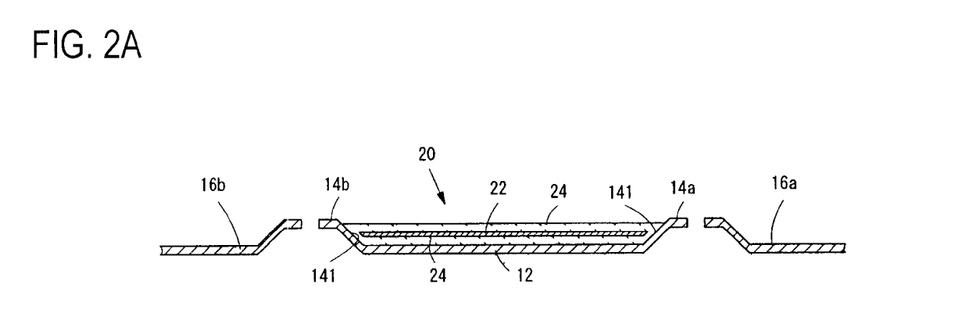
FIG. 2A is a sectional view showing a lead frame having an optical waveguide.
Figure 2B:
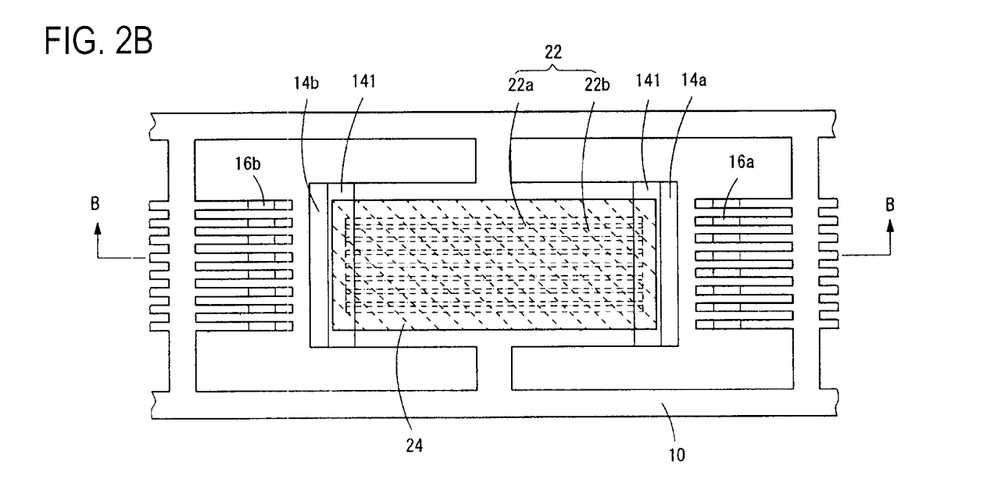
FIG. 2B is a plan view showing the lead frame having the optical waveguide.

FIGS. 2A and 2B show a structure of a lead frame 20 having an optical waveguide 22 which is mounted on the lead frame 10 having the mirror section. FIG. 2A is a sectional view taken along a B-B line in FIG. 2B showing the lead frame 20 having the optical waveguide and FIG. 2B is a plan view.

In the optical waveguide 22, a plurality of linear core portions 22a is arranged on a plane basis at a predetermined interval and is surrounded by a cladding portion 22b. The optical waveguide 22 in the example shown in the drawing has seven core portions 22a.

The support plate 12 and the mirror sections 14a and 14b in the lead frame 10 are formed corresponding to a size of the optical waveguide 22. Therefore, the optical waveguide 22 is disposed with both edges of the optical waveguide 22 aligned with the mirror surface portion 141.

Figure 2C:
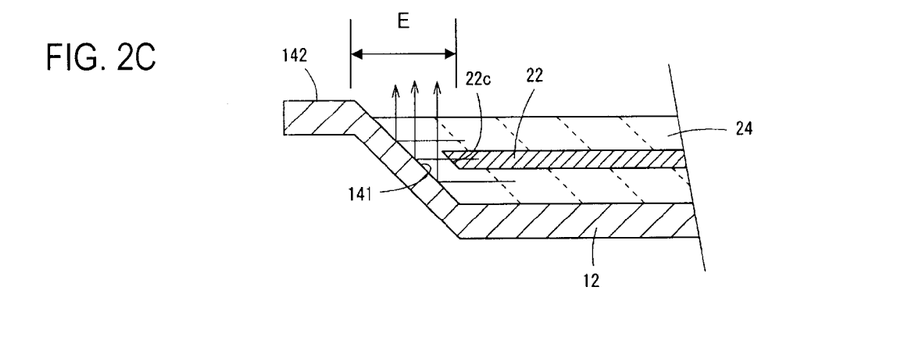
FIG. 2C is an enlarged view showing the vicinity of a position in which the optical waveguide is to be mounted.

The optical waveguide 22 is bonded and attached onto the support plate 12 by using an adhesive 24. When the optical waveguide 22 is to be bonded to the support plate 12, the optical waveguide 22 is aligned and bonded in such a manner that an end face of the optical waveguide 22 is positioned in a plane region of the mirror surface portion 141. The plane region of the mirror surface potion 141 is a region of the light reflecting surface (tilted surface) of the mirror surface portion 141 in a longitudinal direction and is shown in FIG. 2C by "E". In other words, the optical waveguide 22 is aligned in such a manner that a light which is radiated from the optical waveguide 22 mounted on the support plate 12 is incident on a surface of the mirror surface portion 141. In order to bond the optical waveguide 22 in parallel with a surface of the support plate 12, it is also possible to bond the optical waveguide 22 by using an adhesive film having a uniform thickness.

The optical waveguide 22 causes a light to be incident/radiated on/from an end face of the core portion 22a. For this reason, it is preferable to fill a material (a resin) having an equal refractive index to that of the cladding portion 22b of the optical waveguide 22 in at least an optical path portion of a light which is incident/radiated on/from the optical waveguide 22. For the adhesive 24, it is also possible to use an adhesive having an equal refractive index to that of the cladding portion 22b.

FIG. 2C is an enlarged view showing a structure in the vicinity of a portion to which the optical waveguide 22 is bonded. The optical waveguide 22 is mounted in such a manner that an end face (an edge) is positioned in the plane region of the mirror surface portion 141. The mirror surface portion 141 has a function for converting, by 90 degrees, the optical path of a light which is incident on or radiated from the optical waveguide 22. Therefore, a variation in a position of the optical waveguide 22 (a position placed apart from the surface of the support plate 12) with respect to the mirror surface portion 141 emerges as a shift of left and right positions of a light reflected by the mirror surface portion 141 in respect of a light emitted from the optical waveguide 22. When the optical waveguide 22 is to be bonded onto the support plate 12, accordingly, it is preferable to bond the optical waveguide 22 in such a manner that a distance from the support plate 12 is as constant as possible. When the optical device is to be mounted at a subsequent step, however, it is possible to adjust a mounting position for the optical device. For this reason, it is preferable to bond the optical waveguide 22 in such a manner that the mounting position is set into a defined range.

When the optical waveguide 22 is to be mounted, it is effective to dispose an end of the optical waveguide 22 as close to the mirror surface portion 141 as possible in order to suppress an optical loss. In the embodiment, the end face of the optical waveguide 22 is subjected to bevel cutting (is cut by 45 degrees) and the optical waveguide 22 is mounted in such a manner that a tilted end face 22c of the optical waveguide 22 is parallel with the mirror surface portion 141.

By cutting the end face of the optical waveguide 22 with a tilt, thus, it is possible to extend the end face 22c of the optical waveguide 22 to a position in which the end face 22c overlaps with the plane region of the mirror surface portion 141 and to dispose the end face 22c of the optical waveguide 22 to approach the mirror surface portion 141. In other words, it is possible to extend the end face 22c of the optical waveguide 22 from the edge portion of the support plate 12 in the longitudinal direction to dispose the end face 22c of the optical waveguide 22 to approach the mirror surface portion 141.

The optical waveguide 22 is obtained by sequentially cutting, into a predetermined length, an optical waveguide material having the core portion 22a and the cladding portion 22b and formed to take a shape of a thin and long film. When the optical waveguide material is to be cut, oblique cutting is carried out to obtain a cut surface. Consequently, it is possible to obtain the optical waveguide 22 having the end face 22c to be a slant face.

Figure 3A:
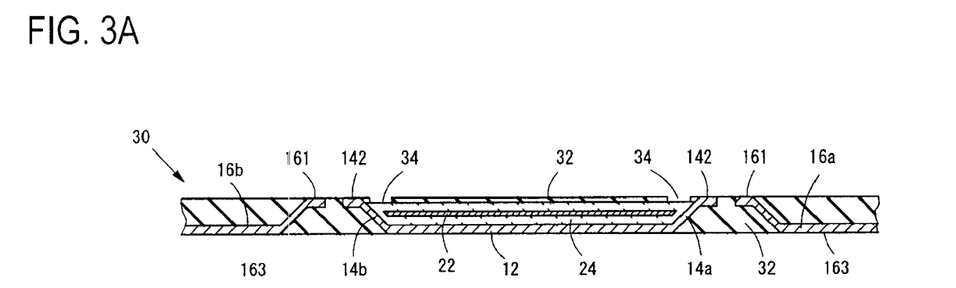
FIG. 3A is a sectional view showing a lead frame having an optical waveguide obtained after resin sealing and FIG. 3B is a plan view showing the lead frame having the optical waveguide obtained after resin sealing.
Figure 3B:
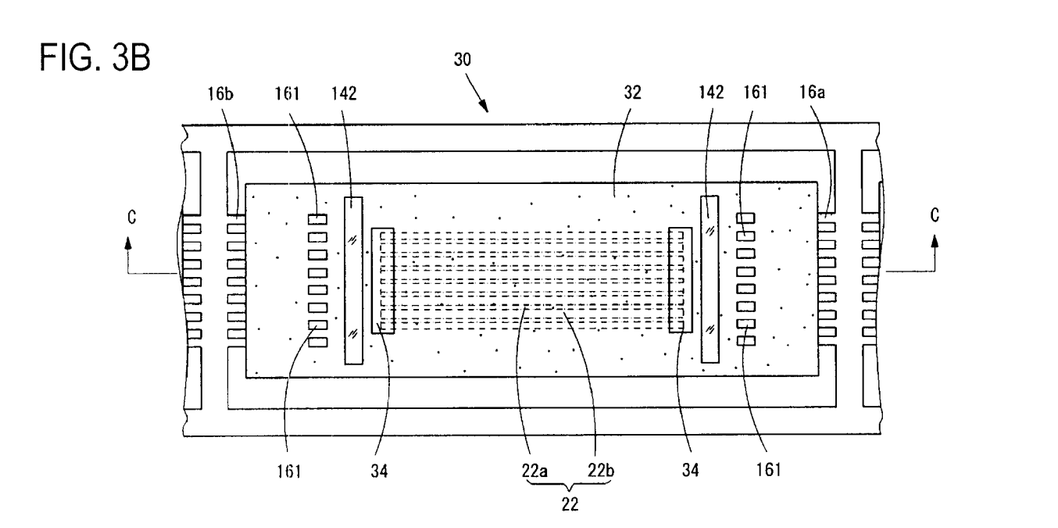

FIGS. 3A and 3B show a lead frame 30 having an optical waveguide obtained by further filling, with a resin, the lead frame 20 having the optical waveguide 22. FIG. 3A is a sectional view taken along a C-C line in FIG. 3B showing the lead frame 30 having the optical waveguide which is obtained after resin sealing, and FIG. 3B is a plan view.

The lead frame 30 is formed through the resin sealing in order to expose surfaces of the bonding portions 142 of the mirror sections 14a and 14b and those of the pads 161 of the lead sections 16a and 16b on a level with an external surface of a resin 32 to be a resin sealing portion and to expose a lower surface of the support plate 12 and lower surfaces (surfaces) of the lead sections 16a and 16b on a level with the external surface of the resin 32. The resin sealing for the lead frame 20 can be carried out in the same manner as in a method of performing resin sealing for the lead frame.

Although the optical waveguide 22 is sealed with the resin 32, the portion for causing a light to be incident/radiated together with the optical waveguide 22 is set to be an optical opening portion 34 and is not coated with the resin 32 in order to optically couple the optical waveguide 22 to the optical device.

Since the optical opening portion 34 serves to cause a light to pass between the optical device and the optical waveguide 22, it is formed to have such a shape as to consider a positional shift when the optical waveguide 22 is to be mounted on the lead frame 10.

Through the sealing with the resin 32, as shown in FIG. 3B, the bonding portions 142 of the mirror sections 14*a* and 14*b* are exposed in a shape of a slender rectangle and the pads 161 of the lead sections 16*a* and 16*b* are exposed in lines to one of the external surfaces of the resin sealing portion. The lower surface of the support plate 12 and lower surfaces of the connecting lead portions 163 of the lead sections 16*a* and 16*b* are exposed to the other external surface of the resin sealing portion. The resin sealing portion of the lead frame 30 is formed as a package body in which upper and lower surfaces are flat.

The optical opening portions 34 are formed along the bonding portions 142 of the mirror sections 14*a* and 14*b* which are exposed to the external surface of the resin 32.

The lead frame having the optical waveguide can be provided as a product in a state in which the optical waveguide 22 is mounted on the lead frame 10 having the mirror section as shown in FIG. 2A and can be provided as a product in a state in which the optical waveguide 22 is subjected to the resin sealing as shown in FIG. 3A. It is easy to handle the product in the case in which the lead frame 20 having an optical waveguide is subjected to the resin sealing.

(Package for Photoelectric Wiring)

Figure 4A:
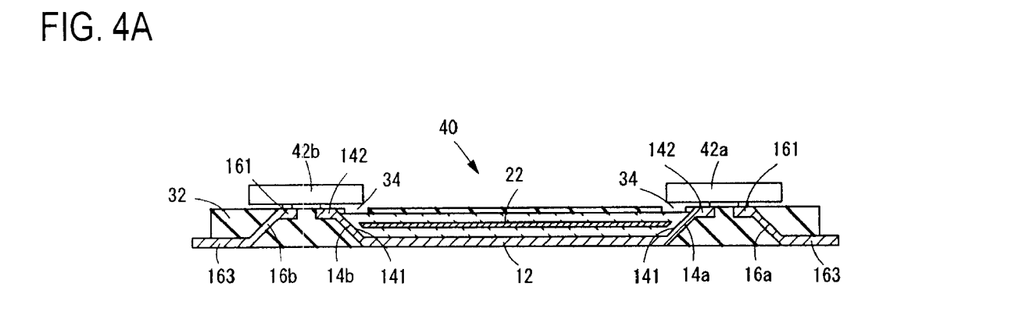
FIG. 4A is a sectional view showing a package for a photoelectric wiring and FIG. 4B is a plan view showing the package for a photoelectric wiring.
Figure 4B:
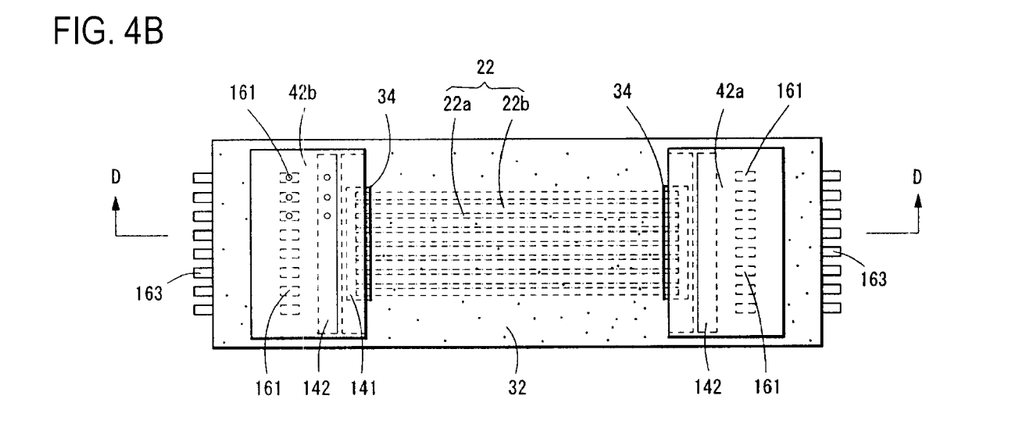

FIGS. 4A and 4B show a package 40 for a photoelectric wiring which is formed by mounting optical devices 42*a* and 42*b* on the lead frame 30 having the optical waveguide. FIG. 4A is a sectional view taken along a D-D line in FIG. 4B showing the package 40 for a photoelectric wiring, and FIG. 4B is a plan view.

The package 40 for a photoelectric wiring is formed by mounting a pair of light emitting and receiving devices as optical devices on the lead frame 30. In the embodiment, the light emitting device is mounted as the optical device 42*a* at one of sides where the mirror section 14*a* is formed and the light receiving device is mounted as the optical device 42*b* at the other side where the mirror section 14*b* is formed.

Light emitting and receiving portions are formed in the light emitting and receiving devices to be the optical devices 42*a* and 42*b* in an identical array to the core portion 22*a* formed in the optical waveguide 22.

When the optical devices 42*a* and 42*b* are to be mounted on the lead frame 30, the optical devices 42*a* and 42*b* are positioned and mounted on the lead frame 30 in such a manner that mutual positions of the optical devices 42*a* and 42*b* and the optical waveguide 22 are coincident with each other.

Figure 5A:
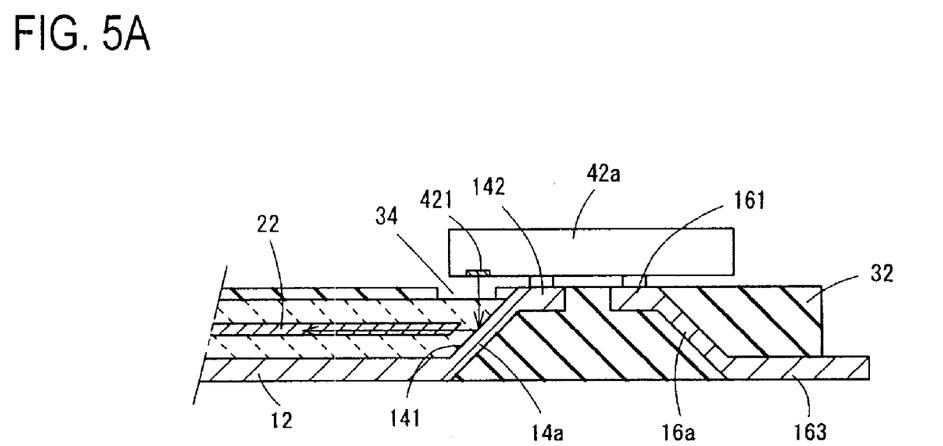
FIGS. 5A and 5B are sectional views showing an arranging position relationship between an optical device and an optical waveguide.
Figure 5B:
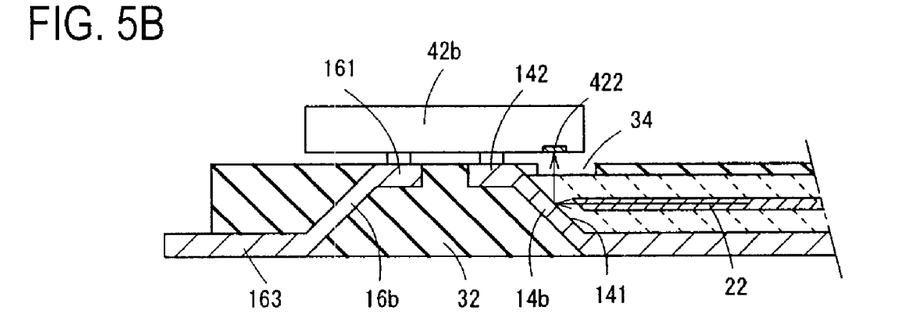

FIGS. 5A and 5B are enlarged views showing a state in which the optical device 42*a* to be the light emitting device and the optical device 42*b* to be the light receiving device are mounted.

As shown in FIG. 5A, when the optical device 42*a* is to be mounted, it is aligned in such a manner that a light emitted from a light emitting portion 421 formed in the optical device 42*a* is reflected by the mirror surface portion 141 of the mirror section 14*a* and enters the core portion 22*a* of the optical waveguide 22.

When the optical device 42*b* is to be mounted, it is aligned in such a manner that a light emitted from the core portion 22*a* of the optical waveguide 22 is reflected by the mirror surface portion 141 of the mirror section 14*b* and is incident on a light receiving portion 422 of the light receiving device.

The optical devices 42*a* and 42*b* and the optical waveguide 22 are optically coupled through the optical opening portion 34 formed on the upper surface of the resin sealing portion.

An electrical connection of the optical devices 42*a* and 42*b* and the signal line is carried out by connecting electrodes formed on the optical devices 42*a* and 42*b* to the pads 161 of the lead sections 16*a* and 16*b*. The optical devices 42*a* and 42*b* are mounted by bonding the electrodes of the optical devices 42*a* and 42*b* to the pads 161 through a conductive material such as a solder or a conductive adhesive.

The bonding portions 142 formed on the ends of the mirror sections 14*a* and 14*b* can be utilized to make an electrical connection by carrying out an electrical connection to the electrodes provided on the optical devices 42*a* and 42*b* or can be utilized as the bonding portions for reliably bonding the optical devices 42*a* and 42*b* to the lead frame 30. Since the bonding portions 142 are electrically conducted differently from the lead sections 16*a* and 16*b*, they can be utilized as common ground potentials, for example.

At a step of forming the lead frame 30 having the optical waveguide, there is carried out an operation for bonding and attaching the optical waveguide 22 to the support plate 12 of the lead frame 10 having the mirror section. Therefore, a slight variation is made for each lead frame 30 in a position in which the optical waveguide 22 is attached.

At a step of forming the package 40 for a photoelectric wiring, the mounting positions of the optical devices 42*a* and 42*b* are adjusted and they are thus mounted for each lead frame 30.

Also in the case in which an optical waveguide is fabricated into a board through an exposing treatment when a photoelectric wiring board is to be formed, it is impossible to avoid a variation in a manufacture, that is, a positional shift of an exposing pattern. In the embodiment, the positional shift is absorbed by adjusting the positions in which the optical devices 42*a* and 42*b* are to be mounted on the lead frame 30. According to the method, there is an advantage that the manufacturing process can be simplified and the package 40 for a photoelectric wiring having no variation in a characteristic can be obtained.

(Mounting Structure)

Figure 6:
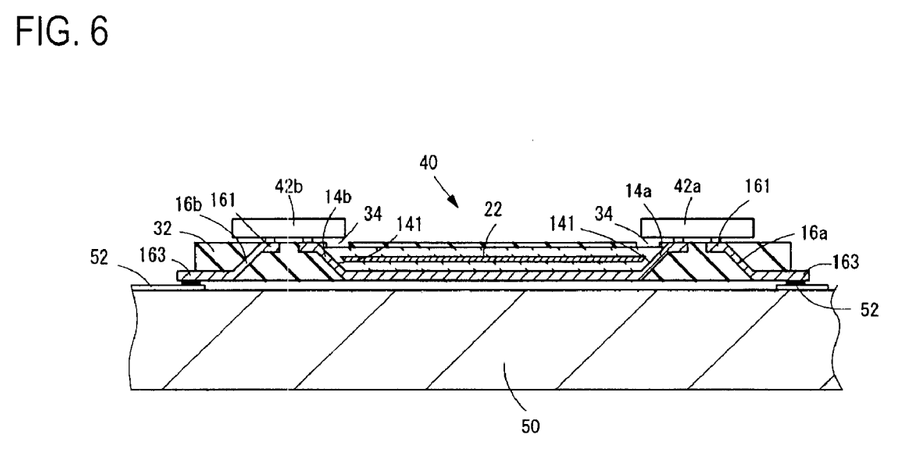
FIG. 6 is a sectional view showing a state in which the package for a photoelectric wiring is mounted on a mounting board.

FIG. 6 shows a state in which the package 40 for a photoelectric wiring is mounted on a mounting board 50.

The package 40 for a photoelectric wiring is mounted by forming a wiring connecting portion 52 on a surface of the mounting board 50 corresponding to a planar arrangement of a connecting lead portion 163 and connecting the wiring connecting portion 52 to the connecting lead portion 163 through solder bonding.

The connecting lead portion 163 is exposed to an opposite surface to a surface on which the optical devices 42*a* and 42*b* are mounted in the package 40 for a photoelectric wiring. Therefore, it is preferable to bond the wiring connecting portion 52 to the connecting lead portion 163 in order to oppose the connecting lead portion 163 to the mounting board 50.

The mounting board 50 is a wiring board for mounting a semiconductor device such as an MPU, and the package 40 for a photoelectric wiring is used as a wiring for connecting the semiconductor devices. The package 40 for a photoelectric wiring according to the embodiment serves to transmit an electrical signal through the optical devices 42a and 42b and the optical waveguide 22. By replacing an electric wiring in the wiring board through the package 40 for a photoelectric wiring, it is possible to replace the electric wiring with an optical wiring, thereby connecting the semiconductor devices.

In the case in which the package for a photoelectric wiring according to the invention is used, it is preferable to determine an arrangement of the semiconductor devices such as MPUs to be mounted on the mounting board and that of the package for a photoelectric wiring according to the invention as a wiring for connecting the semiconductor devices.

By preparing plural types of products having optical waveguides, which includes the different number of core portions having different lengths, as the packages for a photoelectric wiring, it is possible to select a necessary one of the packages for a photoelectric wiring and to design the mounting board in a designing operation. In other words, by using the package for a photoelectric wiring as a component, it is possible to obtain a mounting board having a configuration in which almost all of electric wirings are replaced with optical wirings. Actually, a wiring connecting portion is formed in alignment with a position in which the semiconductor device is to be connected to the package for a photoelectric wiring over the board and the semiconductor device such as the MPU and the package for a photoelectric wiring are mounted corresponding to the wiring connecting portion.

By replacing the electric wiring with the optical wiring, it is possible to increase a speed of a signal transmission and to eliminate a drawback that a noise is mixed into a signal. Thus, it is possible to mount a semiconductor product at a higher speed.

Since the package for a photoelectric wiring according to the invention utilizes the lead frame 10 which can be formed by an identical method to the related-art lead frame manufacturing method, it can easily be mass-produced and can be provided as an article having an optical wiring function with a reduction in a manufacturing cost.

Although there has been described the example in which the optical waveguide 22 having the core portion 22a disposed straight is used in the embodiment, the number, arranging interval and planar arranging configuration of the core portions 22a to be formed in the optical waveguide is not restricted particularly. The lead frame having an optical waveguide according to the invention can have various configurations corresponding to the configuration of the optical waveguide, for example, the shape of the support plate of the lead frame having a mirror section and that of the lead section can be designed properly.

What is claimed is:

1. A lead frame comprising:
   a support plate;
   mirror sections formed on both edges of the support plate, each of the mirror sections having a mirror surface portion inclined at an angle of about 45 degrees with respect to a planar direction of the support plate in a side direction; and
   lead sections,
   wherein the support plate, the mirror sections and the lead sections are monolithic with each other.

2. The lead frame according to claim 1, wherein
   the support plate has a planar shape of a rectangle and is adapted to support an optical waveguide,
   each of the mirror sections has a bonding portion formed on an end of the mirror surface portion in parallel with the planar direction of the support plate, and
   each of the lead sections has a pad adapted to be electrically connected to an optical device and a connecting lead portion adapted to be connected to a mounting board.

3. The lead frame according to claim 2, wherein the pad of the lead section is formed in parallel with the surface of the support plate on a level with the bonding portion of the mirror section, and the connecting lead portion is formed in parallel with the surface of the support plate on a level with the support plate.

4. The lead frame according to claim 1, further comprising:
   an optical waveguide mounted on the support plate, the optical waveguide having a plurality of core portions disposed in parallel and a cladding surrounding the core portions,
   wherein the optical waveguide is mounted with an end face aligned with the mirror surface portion.

5. The lead frame according to claim 4, further comprising:
   a resin which seals the lead frame including the optical waveguide to form a resin sealing portion, the resin sealing portion having an optical opening portion provided in a portion of an optical path of a light which is incident on and radiated from the core portion of the optical waveguide.

6. The lead frame according to claim 4, wherein the optical waveguide has the end face cut at 45 degrees and aligned in parallel with a slant face of the mirror surface portion.

7. The lead frame according to claim 4, wherein
   the support plate has a planar shape of a rectangle, and
   the optical waveguide has a planar shape of a rectangle.

8. The lead frame according to claim 4, wherein
   the support plate has a planar shape of a rectangle,
   each of the mirror sections has a bonding portion formed on an end of the mirror surface portion in parallel with the planer direction of the support plate,
   each of the lead sections has a pad adapted to be electrically connected to the optical device and a connecting lead portion adapted to be connected to a mounting board, and
   a surface of the bonding portion and a surface of the pad are exposed on a level with one of external surfaces of the resin sealing portion and a surface of the connecting lead portion is exposed on a level with the other external surface of the resin sealing portion.

9. A package for a photoelectric wiring comprising:
   a lead frame according to claim 4; and
   a pair of light emitting device and light receiving device mounted on the lead frame and eclectically connected to the lead portions, respectively,
   wherein the light emitting device and the light receiving device are mounted in alignment with an optical path of a light reflected by the mirror surface portion and transmitted through the core portions at both ends of the optical waveguide.

10. The package for a photoelectric wiring according to claim 9, wherein
    the lead frame has a resin which seals the lead frame including the optical waveguide to form a resin sealing portion, the resin sealing portion having optical opening portions provided in a portion of the optical path of a light which is incident on and radiated from the core portion of the optical waveguide, and
    the optical emitting device and the optical receiving device are mounted on an external surface of the resin sealing portion in alignment with the optical opening portions.

11. The package for a photoelectric wiring according to claim 9, wherein
the light emitting device has a light emitting portion provided in a coincident arrangement with a planar array of the core portion of the optical waveguide, and
the light receiving device has a light receiving portion provided in a coincident arrangement with the planar array of the core portion of the optical waveguide.

* * * * *